US012672494B2

(12) United States Patent
Yang et al.

(10) Patent No.: US 12,672,494 B2
(45) Date of Patent: Jun. 30, 2026

(54) IMAGE-BASED SEMICONDUCTOR DEVICE PATTERNING METHOD USING DEEP NEURAL NETWORK

(71) Applicant: SAMSUNG ELECTRONICS CO., LTD., Suwon-si (KR)

(72) Inventors: Jaewon Yang, Suwon-si (KR); Seongjin Park, Suwon-si (KR); Sangchul Yeo, Gwangsan-gu (KR); Seonmin Rhee, Seoul (KR); Hyeok Lee, Suwon-si (KR); Sooryong Lee, Seoul (KR); Seungju Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 790 days.

(21) Appl. No.: 18/072,998

(22) Filed: Dec. 1, 2022

(65) Prior Publication Data

US 2023/0197460 A1      Jun. 22, 2023

(30) Foreign Application Priority Data

Dec. 17, 2021    (KR) ........................ 10-2021-0182211
Aug. 19, 2022    (KR) ........................ 10-2022-0104329

(51) Int. Cl.
*H10P 50/00*        (2026.01)
*G03F 7/00*         (2006.01)
*G06T 3/4007*       (2024.01)
*G06V 10/46*        (2022.01)
*G06V 10/82*        (2022.01)

(52) U.S. Cl.
CPC ........ *H10P 50/691* (2026.01); *G03F 7/70616* (2013.01); *G06T 3/4007* (2013.01); *G06V 10/46* (2022.01); *G06V 10/82* (2022.01)

(58) Field of Classification Search
CPC ...... H01L 21/308; G06V 10/82; G06V 10/46; G03F 7/70616; G06T 3/4007
USPC .......................................................... 716/53
See application file for complete search history.

(56) References Cited

U.S. PATENT DOCUMENTS

| | | | |
|---|---|---|---|
| 7,085,698 B2 | 8/2006 | Tsai et al. | |
| 8,806,387 B2 | 8/2014 | Cao et al. | |
| 9,965,901 B2 | 5/2018 | Zhang et al. | |
| 10,043,261 B2 | 8/2018 | Bhaskar et al. | |
| 10,691,864 B2 * | 6/2020 | Wang | G03F 1/36 |
| 11,093,840 B2 | 8/2021 | Rothstein et al. | |
| 2015/0379666 A1 * | 12/2015 | Redzic | G06T 3/4007 |
| | | | 345/646 |
| 2019/0303717 A1 | 10/2019 | Bhaskar et al. | |

(Continued)

FOREIGN PATENT DOCUMENTS

| | | |
|---|---|---|
| KR | 10-2021-0057807 A | 5/2021 |
| KR | 1020210116613 A | 9/2021 |

(Continued)

*Primary Examiner* — Suresh Memula
(74) *Attorney, Agent, or Firm* — Muir Patent Law, PLLC

(57)        ABSTRACT

A semiconductor device patterning method includes generating an input image by imaging information about a pattern of a sample, acquiring an output image of the pattern of the sample after a preset semiconductor process with respect to the sample, generating a predictive model through learning using a Deep Neural Network (DNN) with the input image and the output image, and predicting a pattern image after the semiconductor process for a pattern of a semiconductor device by using the predictive model.

17 Claims, 16 Drawing Sheets

(56) References Cited

U.S. PATENT DOCUMENTS

| 2020/0189192 | A1 | 6/2020 | Cao et al. |
| 2020/0272865 | A1* | 8/2020 | Niewczas ............. G06V 10/82 |
| 2020/0380362 | A1 | 12/2020 | Cao et al. |
| 2020/0387750 | A1* | 12/2020 | Shcherbinin ............. G06T 5/60 |
| 2021/0097673 | A1 | 4/2021 | Neumann et al. |
| 2021/0272273 | A1 | 9/2021 | Brauer |
| 2021/0357566 | A1 | 11/2021 | Simmons et al. |
| 2022/0092239 | A1* | 3/2022 | Kim ..................... G06N 3/0475 |
| 2022/0171913 | A1* | 6/2022 | Lee ......................... G06N 3/094 |
| 2022/0180503 | A1* | 6/2022 | Oh .......................... G06F 18/22 |
| 2023/0197460 | A1* | 6/2023 | Yang ................... G06V 10/752 |
| | | | 438/689 |
| 2024/0160827 | A1* | 5/2024 | Yeo ..................... H01L 21/0273 |

FOREIGN PATENT DOCUMENTS

| KR | 1020210133364 | A | 11/2021 | |
| TW | 202113633 | A | 4/2021 | |
| TW | 202117576 | A | 5/2021 | |
| WO | WO-2020169303 | A1 * | 8/2020 | ............. G06N 3/09 |

* cited by examiner

FIG. 1

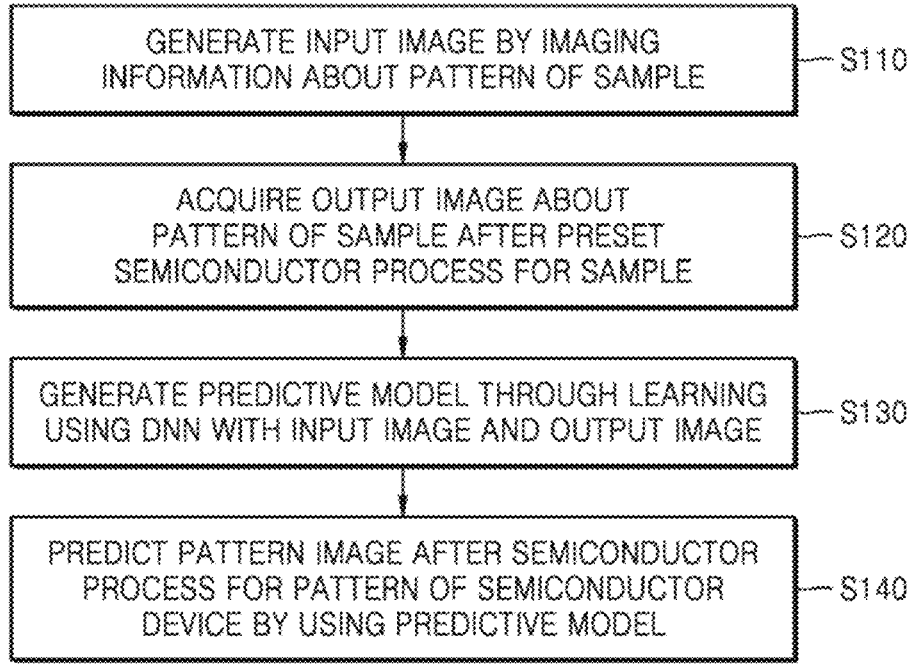

GENERATE INPUT IMAGE BY IMAGING
INFORMATION ABOUT PATTERN OF SAMPLE  — S110

ACQUIRE OUTPUT IMAGE ABOUT
PATTERN OF SAMPLE AFTER PRESET
SEMICONDUCTOR PROCESS FOR SAMPLE  — S120

GENERATE PREDICTIVE MODEL THROUGH LEARNING
USING DNN WITH INPUT IMAGE AND OUTPUT IMAGE  — S130

PREDICT PATTERN IMAGE AFTER SEMICONDUCTOR
PROCESS FOR PATTERN OF SEMICONDUCTOR
DEVICE BY USING PREDICTIVE MODEL  — S140

Layer(DBU)          bi-cubic filter : 3          bi-cubic filter : 9

IMAGE-BASED SEMICONDUCTOR DEVICE PATTERNING METHOD USING DEEP NEURAL NETWORK

CROSS-REFERENCE TO RELATED APPLICATIONS

This application is based on and claims priority under 35 U.S.C. § 119 to Korean Patent Application No. 10-2021-0182211, filed on Dec. 17, 2021, and Korean Patent Application No. 10-2022-0104329, filed on Aug. 19, 2022, in the Korean Intellectual Property Office, the disclosures of which are incorporated by reference herein in their entirety.

BACKGROUND

1. Field

Embodiments relate to a semiconductor device patterning method, and more particularly, to an image-based semiconductor device patterning method.

2. Description of the Related Art

In a semiconductor process, a photolithography process using a mask may be performed to form a pattern on a semiconductor substrate, such as a wafer. The mask may refer to a pattern transfer body in which a pattern shape of an opaque material is formed on a transparent base material. To make such a mask, after designing the layout for the intended pattern first, Optical Proximity Correction (OPC) layout data acquired through OPC may be transferred as Mask Tape-Out (MTO) design data. Thereafter, mask data preparation (MDP) may be performed based on the MTO design data, and an exposure process may be performed on the substrate for a mask. Moreover, the pattern may be formed on the semiconductor substrate by performing a photoresist (PR) pattern forming process on the semiconductor substrate by using a mask and an etching process using the PR pattern.

SUMMARY

According to an embodiment, there is provided a semiconductor device patterning method including: generating an input image by imaging information about a pattern of a sample; acquiring an output image of the pattern of the sample after a preset semiconductor process with respect to the sample; generating a predictive model through learning using a Deep Neural Network (DNN) with the input image and the output image; and predicting a pattern image after the semiconductor process for a pattern of a semiconductor device by using the predictive model.

According to an embodiment, there is provided a semiconductor device patterning method including: generating an input image by rasterizing a layout of a mask pattern corresponding to a pattern of a sample; obtaining an image of an Optical Proximity Corrected (OPCed) layout for the mask pattern as an output image; generating a predictive model through learning using a DNN with the input image and the output image; predicting an image of an OPCed layout for a pattern of a semiconductor device by using the predictive model; determining whether the predicted image of the OPCed layout satisfies a set condition; manufacturing a mask based on the image of the OPCed layout when the condition is satisfied; and forming a pattern on a semiconductor device by using the mask.

According to an embodiment, there is provided a semiconductor device patterning method including: acquiring an After Develop Inspection (ADI) image of a pattern of a sample; extracting a contour image from the ADI image; generating an input image by rasterizing the contour image; obtaining an After Cleaning Inspection (ACI) image for the pattern of the sample after an etching process for the sample as an output image; generating a predictive model through learning using a DNN with the input image and the output image; predicting a pattern image of a semiconductor device after the etching process by using the predictive model; determining whether the predicted pattern image after the etching process satisfies a set condition; and forming a pattern on the semiconductor device through the etching process when the condition is satisfied.

BRIEF DESCRIPTION OF THE DRAWINGS

Features will become apparent to those of skill in the art by describing in detail example embodiments with reference to the attached drawings in which:

FIG. 1 is a flowchart schematically illustrating a process of an image-based semiconductor device patterning method using a Deep Neural Network (DNN), according to an example embodiment;

DETAILED DESCRIPTION

Figure 2:
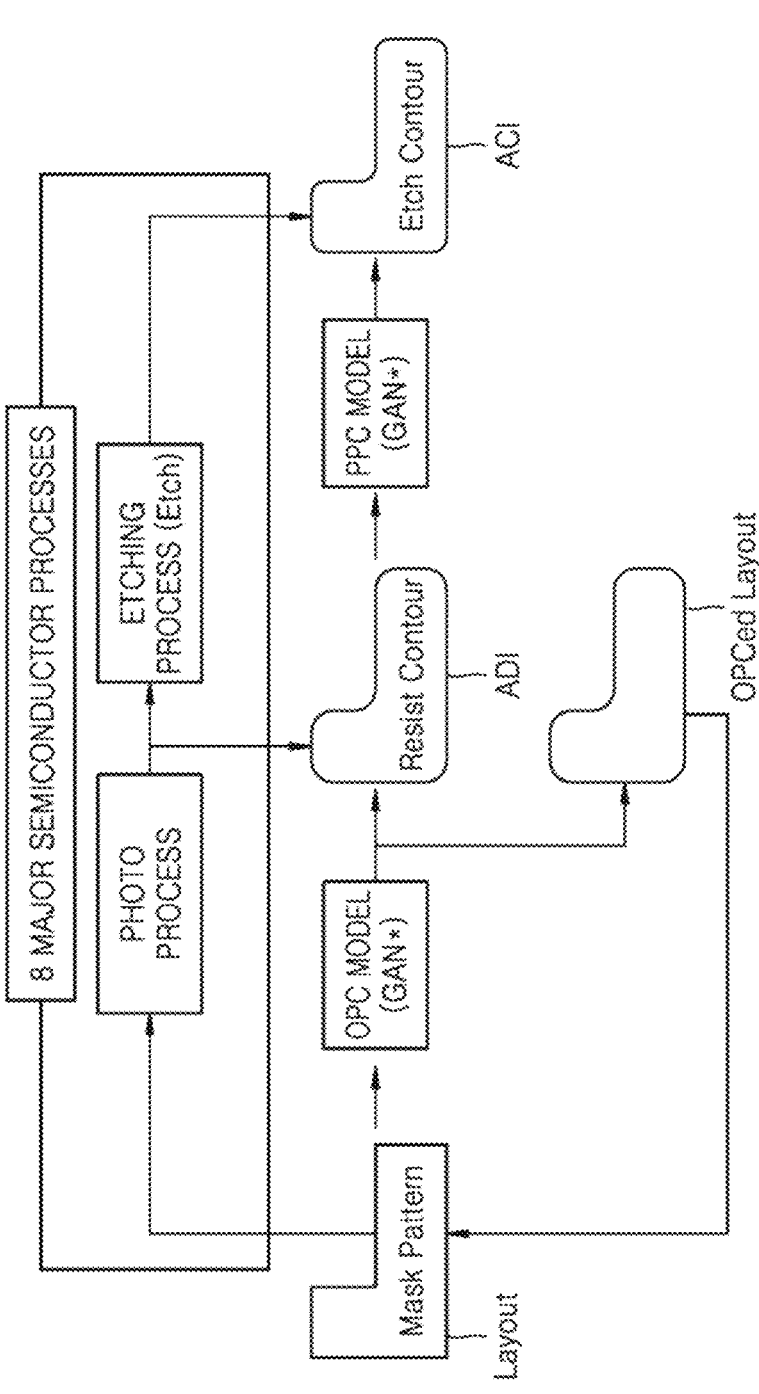
FIG. 2 is a conceptual diagram for explaining a part to which the semiconductor device patterning method of FIG. 1 is applied in 8 major semiconductor processes.
Figure 3A:
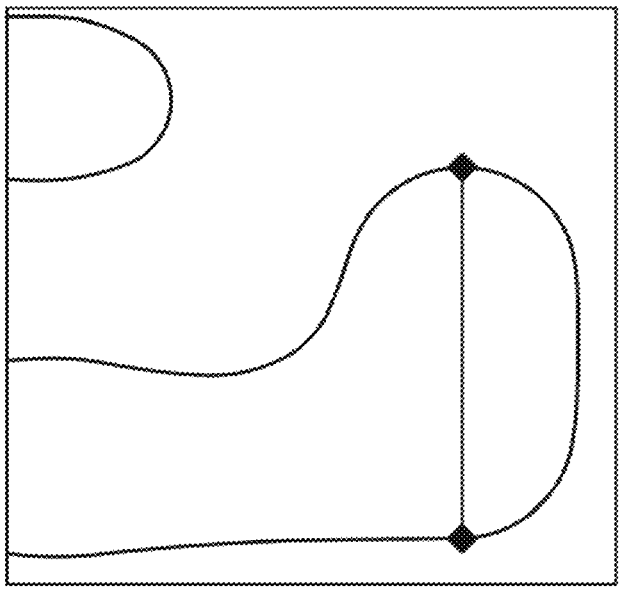
FIGS. 3A to 3C are conceptual diagrams for explaining the difference between critical dimension (CD)-based, contour-based, and image-based models.
Figure 3B:
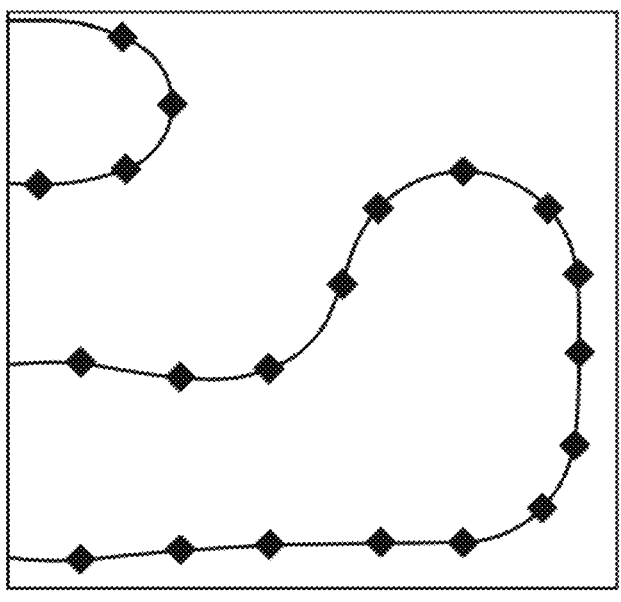
Figure 3C:
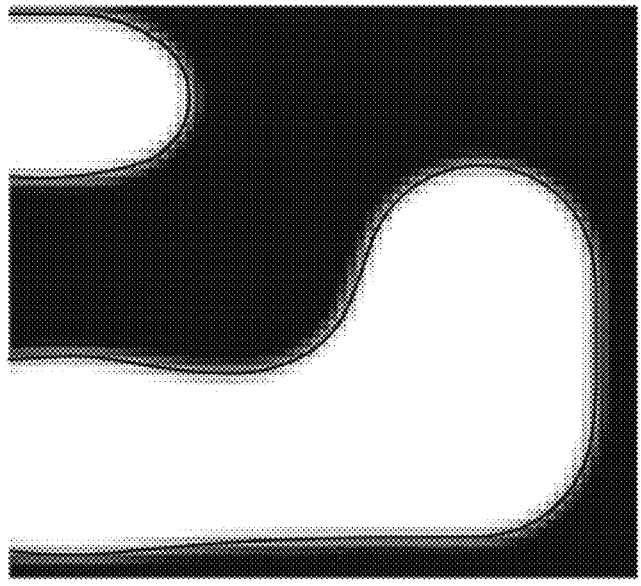

FIG. 1 is a flowchart schematically showing the process of an image-based semiconductor device patterning method using a Deep Neural Network (DNN) according to an example embodiment. FIG. 2 is a conceptual diagram for explaining a part to which the semiconductor device patterning method of FIG. 1 is applied in 8 major semiconductor processes. FIGS. 3A to 3C are conceptual diagrams for explaining the difference between critical dimension (CD)-based, contour-based, and image-based models.

Referring to FIGS. 1 to 3C, in the image-based semiconductor device patterning method (hereinafter, simply referred to as 'semiconductor device patterning method') using a DNN according to the present example embodiment, first, information about a pattern of a sample is imaged to generate an input image (S110). Here, the sample may be a semiconductor device used for DNN learning, e.g., Generative Adversarial Network (GAN) learning. However, in the semiconductor device patterning method according to the present example embodiment, DNN learning is not limited to GAN learning. Hereinafter, DNN may mainly mean GAN unless stated otherwise. In addition, the pattern of the sample may be formed by transferring the pattern on the mask onto the sample through an exposure process. Accordingly, first, a layout for the pattern on the mask corresponding to the pattern of the sample, i.e., the mask layout, may be designed. For reference, in general, the shape of the pattern of the sample may be different from the shape of the pattern on the mask due to the nature of the exposure process. In addition, because the pattern on the mask is reduced-projected and transferred onto the substrate, the pattern on the mask may have a greater size than the pattern of the sample.

The information on the pattern of the sample may be a layout for the pattern on the mask corresponding to the pattern of the sample. A more detailed description thereof will be provided in the description of FIG. 4A. Also, in another example embodiment, the information about the pattern of the sample may be an After Develop Inspection (ADI) image of the pattern of the sample. A more detailed description thereof will be provided in the description of FIG. 4A. In the semiconductor device patterning method according to the present example embodiment, information on the pattern of the sample may be determined in various other ways, e.g., the information about the pattern of the sample may be a near-field image of the pattern on the mask.

The imaging of information may mean rasterization of the corresponding information. Rasterization may refer to a process of converting vector or contour data into bitmap or pixel data. For example, a layout for a pattern on a mask may correspond to a contour image, and the contour image may be converted into a bitmap image through rasterization to generate an input image. In an example embodiment, the ADI image of the pattern of the sample is acquired through a Scanning Electron Microscope (SEM), and after extracting the contour image from the ADI image, rasterization is performed on the contour image to generate an input image of a bitmap image.

In the semiconductor device patterning method according to the present example embodiment, because the input data to the DNN is image data through rasterization, i.e., pixel data, it may be possible to learn by using data that is tens of thousands of times more than an existing CD-based data or contour-based data, and therefore, it may be useful to help avoid model overfitting.

For reference, as recent patterning processes have been refined, existing Optical Proximity Correction (OPC) and Resolution Enhancement Technology (RET) alone may not be sufficient to produce an accurate mask. In the case of miniaturized patterns, because the proportion of 2D patterns gradually increases, for accurate patterning, a model that accurately predicts even 2D patterns is required, and even during wafer verification, it is important to detect 2D pattern defects in a method differentiated from a method of detecting 1D pattern (line & space pattern) defects. In the case of an existing lithography simulation model, such as an OPC model, as shown in FIG. 3A, a CD-based model for predicting the CD of a pattern based on information of a given layout may be used. However, recently, as shown in FIG.

3B, a contour-based model that may better predict the 2D profile of a pattern has been used. The CD-based model is a method of modeling by extracting one or two CDs from one pattern. The contour-based model is a method of modeling using dozens of Edge Placement (EP) information per pattern by adding EP or Edge Placement Error (EPE) at regular intervals of contour to extract pattern information. This contour-based model method may extract more 2D information, but depending on the method of extracting the EP, some information may be omitted. In contrast, in the semiconductor device patterning method according to the present example embodiment, an image-based predictive model may be generated through learning using a DNN. Referring to FIG. 3C, because the image-based model uses all pixels (tens of thousands) corresponding to the pattern for modeling, modeling may be performed using much more 2D information than a contour-based model.

In addition, it may be difficult to effectively utilize a large number of pixel data in a model generated by linearly combining predefined kernels as in a general lithography model. However, the semiconductor device patterning method according to the present example embodiment may find an optimized kernel during learning and utilize a Deep Convolutional GAN (DCGAN) specialized for simulating a lithography phenomenon to provide more accurate modeling using data that has been increased by hundreds of thousands of times. In addition, the semiconductor device patterning method according to the present example embodiment may minimize the time required for the data preprocessing process by using an algorithm that automates the data preprocessing process. In another aspect of the semiconductor device patterning method according to the present example embodiment, various algorithms may be used for image conversion to ensure that the image-based model generated through learning using a DNN has sub-pixel level accuracy. This will be described in more detail in connection with the description of FIGS. 5A to 7B.

After generating an input image through imaging, an output image of a pattern of a sample, after a preset semiconductor process for the sample, is obtained (S120). Here, the semiconductor process may include various processes. For example, in the semiconductor device patterning method according to the present example embodiment, the semiconductor process may include a photo process and an etching process. Referring to FIG. 2, in general, a photo process may refer to a process that forms a photoresist (PR) pattern on a semiconductor device through an exposure process and a development process using a mask. Also, the etching process may refer to an etching process that forms a pattern on a semiconductor device by using the PR pattern.

Meanwhile, in the photo process, OPC may be performed. In general, as a pattern is refined, e.g., made smaller or more dense, an optical proximity effect (OPE) may occur due to the influence between neighboring patterns in the exposure process. To address this, OPC may be employed to correct the layout of the mask pattern. OPC may include a process of acquiring an image or data of a layout of a mask pattern, i.e., an OPC layout, through generation of an optical image of the mask pattern, generation of an OPC model, and simulation using the OPC model. Accordingly, the photo process includes a process of generating an optical proximity-corrected (OPCed) layout through OPC, and a process of manufacturing a mask with the OPCed layout and forming a PR pattern on a semiconductor device through an exposure process using the mask. Meanwhile, to compensate for an etch bias, a Process Proximity Correction (PPC) process may be performed in the etching process.

As a result, an input image and an output image corresponding thereto may vary according to a semiconductor process. For example, if the input image is an image related to the layout of a pattern on a mask and the semiconductor process is an OPC process of a photo process, the output image may be an image of the OPCed layout. In addition, if the input image is an image related to an ADI image for a pattern of a sample and a corresponding semiconductor process is an etching process using a PR pattern, then the output image may be an After Cleaning Inspection (ACI) image for the pattern of the sample. Moreover, if the input image is an image related to a near-field image of a pattern on a mask and the corresponding semiconductor process is an exposure process using a mask, then the output image may be an ADI image of the pattern of the sample.

Referring again to FIG. 1, after obtaining the output image, a predictive model is generated through learning using the DNN with the input image and the output image (S130). Here, the DNN may be a paired GAN or a conditioned GAN using a paired image of an input image and an output image. In general, in the case of GANs, there is a possibility that learning is not stable, and stable learning may be possible by using paired image information as a condition of the GAN. In addition, by using paired images, additional data pre-processing, such as data labeling, may not be required. The process of generating a predictive model through learning using the GAN and the GAN will be described in more detail in connection with the description of FIG. 8.

After generating the predictive model, the pattern image after the semiconductor process for the pattern of the semiconductor device is predicted using the predictive model (S140). For example, when the semiconductor process is an OPC process, the OPCed layout image for the pattern of the semiconductor device may be predicted. Also, when the semiconductor process is an etching process, the ACI image of the pattern of the semiconductor device may be predicted. On the other hand, when the semiconductor process is an exposure process, the ADI image of the pattern of the semiconductor device may be predicted.

Thereafter, it is determined whether the predicted pattern image satisfies a set condition, and if it is satisfied, a pattern is formed on the semiconductor device, and if not satisfied, it is possible to return to operation S130 of generating a predictive model through learning using a DNN to generate a new predictive model. This will be described in more detail in connection with the description of FIGS. 4A and 4B in relation to a certain semiconductor process.

The semiconductor device patterning method according to the present example embodiment may generate an input image through imaging and generate an image-based predictive model through learning using a DNN. The image-based predictive model may accurately predict the image of the pattern after the corresponding semiconductor process. In addition, a pattern required for a semiconductor device may be accurately formed based on accurate prediction of the pattern image.

Figure 4A:
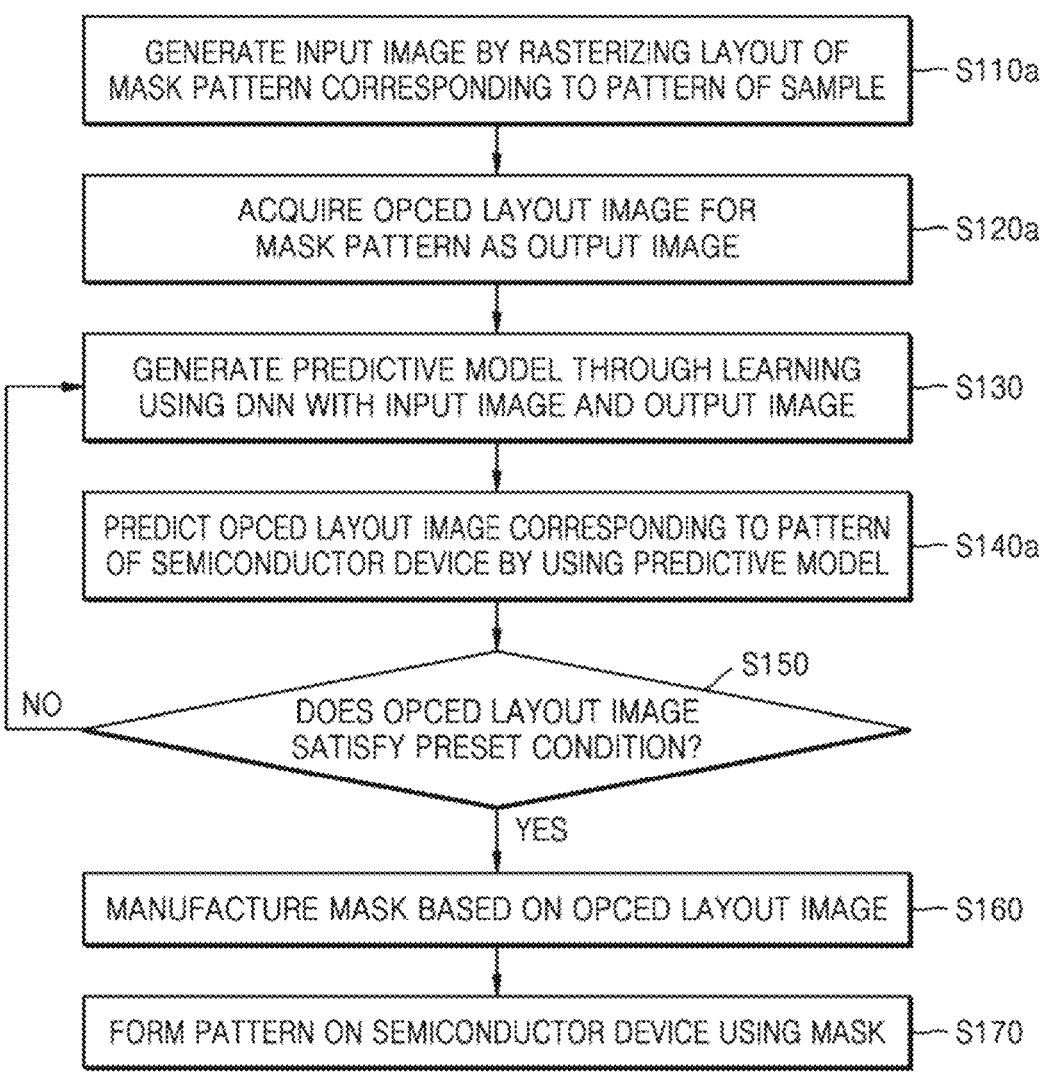
FIGS. 4A and 4B are flowcharts schematically illustrating a process of an image-based semiconductor device patterning method using a DNN, according to example embodiments.
Figure 4B:
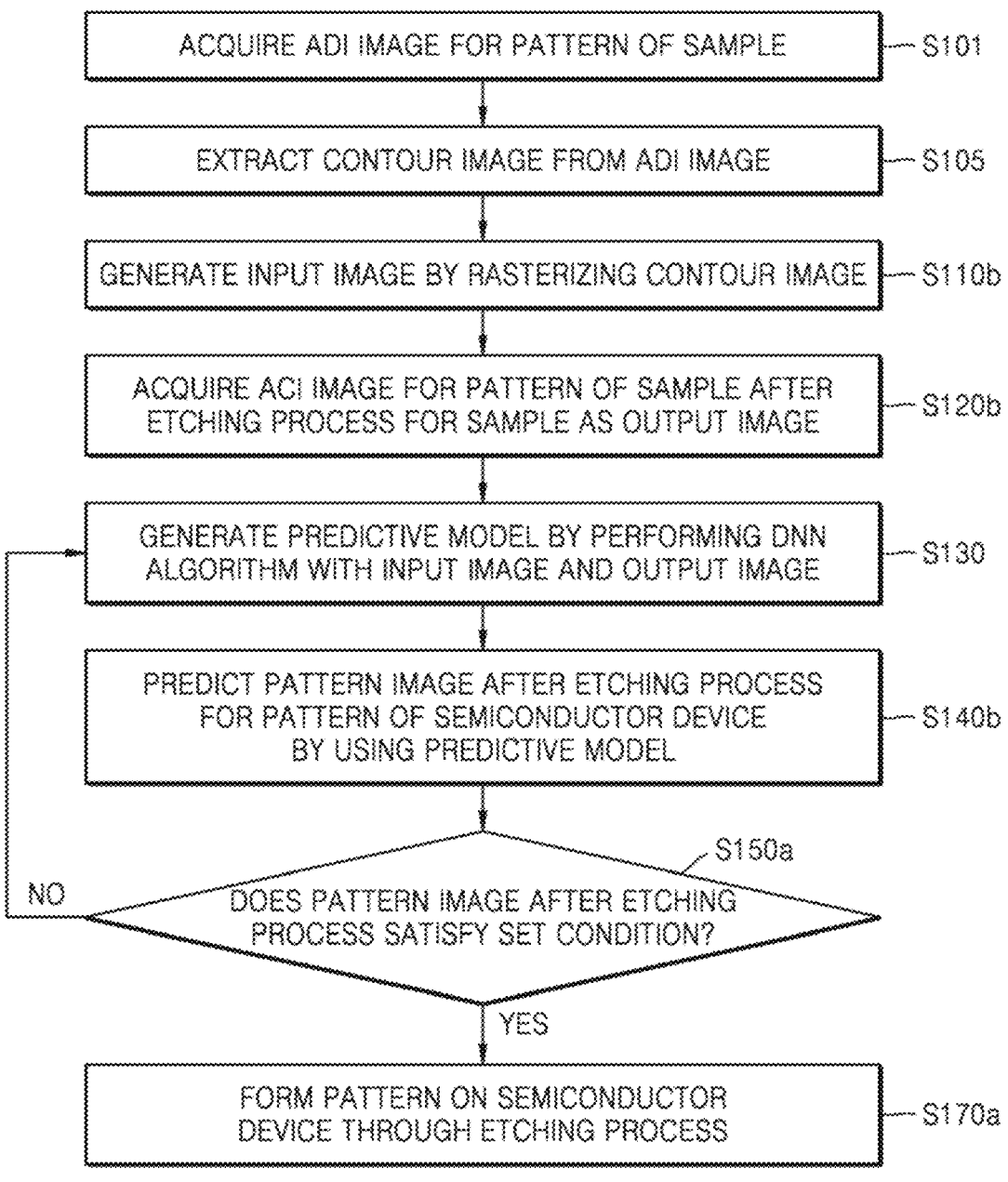

FIGS. 4A and 4B are flowcharts schematically illustrating a process of an image-based semiconductor device patterning method using a DNN, according to example embodiments. Descriptions already given with reference to FIGS. 1 to 3C are briefly given or omitted.

Referring to FIG. 4A, in the semiconductor device patterning method according to the present example embodiment, first, an input image is generated by rasterizing a layout of a mask pattern corresponding to a pattern of a sample (S110a). Here, the layout of the mask pattern may correspond to the contour image. Accordingly, an input image may be generated by converting the contour image of the layout into a bitmap image through rasterization.

After generating an input image through rasterization, an OPCed layout image for the mask pattern is acquired as an output image (S120a). The OPCed layout image may correspond to an image of a layout in which the layout of the mask pattern is changed through OPC. As described above, the process of generating the OPCed layout through OPC may correspond to a part of the photo process.

After obtaining the output image, a predictive model is generated through learning using the DNN with the input image and the output image (S130). The generating of the predictive model in operation S130 is the same as described in the description of the semiconductor device patterning method of FIG. 1.

After generating the predictive model, the image of the OPCed layout corresponding to the pattern of the semiconductor device is predicted using the predictive model (S140a). For example, with respect to a pattern for a required semiconductor device, an initial layout of a mask pattern corresponding thereto may be input to the predictive model to generate an OPCed layout image. The generated OPCed layout image may correspond to the layout image of the mask pattern. Accordingly, it may be possible to predict the OPCed layout image corresponding to the pattern of the required semiconductor device.

Furthermore, in the semiconductor device patterning method according to the present example embodiment, a predictive model is generated between the layout of the mask pattern and the OPCed layout image, and according to an example embodiment, a predictive model may be generated between the pattern of the sample and the OPCed layout image. In the case of such a predictive model, an input image may be generated through SEM image acquisition for a pattern of a sample, contour image extraction from the SEM image, and rasterization of the contour image.

Subsequently, it is determined whether the OPCed layout image satisfies the set condition (S150). In other words, it is determined whether the OPCed layout image generated through the predictive model satisfies the set condition. For example, whether the condition is satisfied may be determined by comparing an error amount (errRMS) expressed in RMS with a set value or by comparing a loss rate with a set value. Here, the error amount or loss rate may be calculated based on the contour image of the target pattern. Moreover, both the error amount and the loss rate may be used for the condition.

If the condition in S150 is satisfied, a mask may be manufactured based on the OPCed layout image (S160). Briefly explaining the mask manufacturing process, first, the OPCed layout image is transmitted to the mask manufacturing team as Mask Task Out (MTO) design data. In general, MTO may refer to requesting mask production by handing over final mask data obtained through the OPC method to a mask production team. The MTO design data may have a graphic data format used in electronic design automation (EDA) software or the like. For example, the MTO design data may have a data format, such as Graphic Data System II (GDS2) and Open Artwork System Interchange Standard (OASIS).

Thereafter, mask data preparation (MDP) is performed based on the MTO design data. The MDP may include, e.g., i) format conversion, called fracturing, ii) augmentation of barcodes for mechanical reading, standard mask patterns for inspection, job decks, and the like, and iii) verification of automatic and manual methods. Here, the job deck may refer to making a text file about a series of instructions, such as batch information of multiple mask files, a reference dose, and exposure speed or method.

After the MDP, the mask substrate is exposed using the mask data, i.e., the E-beam data. Here, exposure may refer to, e.g., E-beam writing. Here, the E-beam writing may be performed by, e.g., a gray writing method using a multi-beam mask writer (MBMW). In addition, E-beam writing may be performed using a Variable Shape Beam (VSB) exposure machine.

After the exposure process, a series of processes may be performed to complete the mask. The series of processes may include, e.g., development, etching, and cleaning. In addition, a series of processes for manufacturing the mask may include a measurement process, a defect inspection process, or a defect repair process. In addition, a pellicle application process may be included. Here, if it is confirmed that there are no contaminant particles or chemical stains through the final cleaning and inspection, the pellicle application process may refer to a process of attaching a pellicle to the mask surface to protect the mask from subsequent contamination during the delivery of the mask and the useful life of the mask.

If the condition in S150 is not satisfied, the process returns to the generating of the predictive model in operation S130 and generates a new predictive model. According to an example embodiment, the process returns to the generating of the input image in operation S110a, and newly generates the input images, and a predictive model through DNN learning may be regenerated by using the new input images.

After manufacturing the mask, a pattern is formed on the semiconductor device by using the mask (S170). For example, a PR pattern may be formed on the semiconductor device through an exposure process using a mask, and the pattern may be formed on the semiconductor device through an etching process using the PR pattern.

Referring to FIG. 4B, in the semiconductor device patterning method according to the present example embodiment, first, an ADI image of a pattern of a sample is acquired (S101). For example, the ADI image may be a SEM image obtained by imaging a PR pattern on a sample with SEM.

Subsequently, a contour image is extracted from the ADI image in operation S105, and an input image is generated by rasterizing the contour image in operation S110b. The process of generating the input image through rasterization may be substantially the same as the process of generating the input image by rasterizing the layout previously.

Thereafter, an ACI image of the pattern of the sample after the etching process for the sample is obtained as an output image (S120b). The ACI image may be a SEM image obtained by imaging a pattern of a semiconductor device with SEM after an etching process using a PR pattern.

After obtaining the output image, a predictive model is generated through learning using the DNN with the input image and the output image (S130). The generating of the predictive model in operation S130 is the same as described in the description of the semiconductor device patterning method of FIG. 1.

After generating the predictive model, the pattern image after the etching process for the pattern of the semiconductor device is predicted using the predictive model (S140a). Here, the pattern image may be an ACI image of the pattern of the semiconductor device after the etching process. More specifically, with respect to an intended pattern of a semiconductor device, an ADI image on a semiconductor device corresponding thereto is first obtained, and the ADI image is input to a predictive model to generate an ACI image of the semiconductor device. Accordingly, it may be possible to predict the ACI image for the intended pattern of the semiconductor device.

Subsequently, it is determined whether the pattern image after the etching process, i.e., the ACI image, satisfies a set condition (S150). In other words, it is determined whether the ACI image generated through the predictive model satisfies the set condition. For example, whether the condition is satisfied may be determined by comparing the error amount expressed in RMS with a set value or by comparing the loss rate with a set value. Here, the error amount or loss rate may be calculated based on the contour image of the target pattern. Moreover, both the error amount and the loss rate may be used for the condition.

If the condition is satisfied, an etching process is performed to form a pattern on the semiconductor device (S170a). If the condition is not satisfied, the process returns to the generating of the predictive model in operation S130 and generates a new predictive model. According to an example embodiment, the process returns to the acquiring of the ADI image in operation S101 and newly generates input images from the beginning, and a predictive model through DNN learning may be regenerated by using the new input images.

Figure 5A:
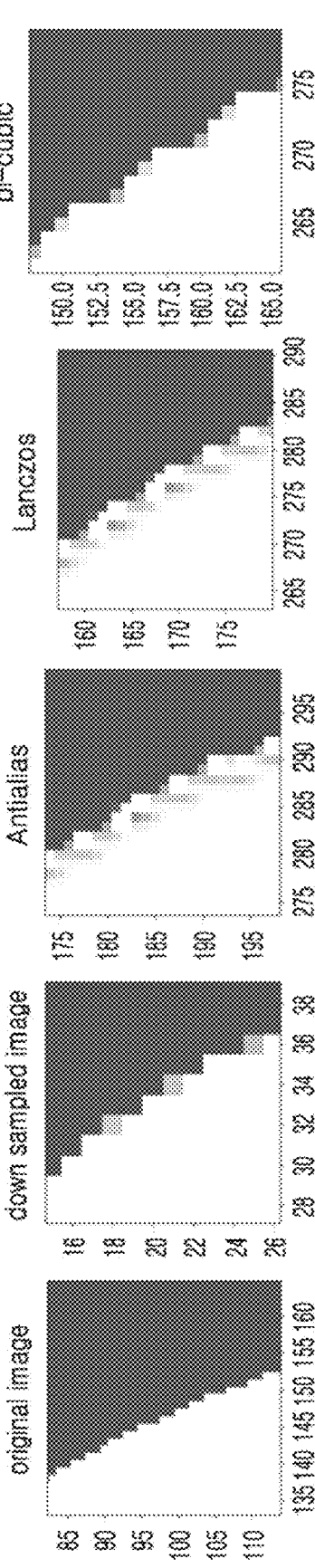
FIGS. 5A and 5B are conceptual diagrams for explaining a method of generating an image so as to secure sub-pixel level accuracy in an input image generating operation of the semiconductor device patterning method of FIG. 1.
Figure 5B:
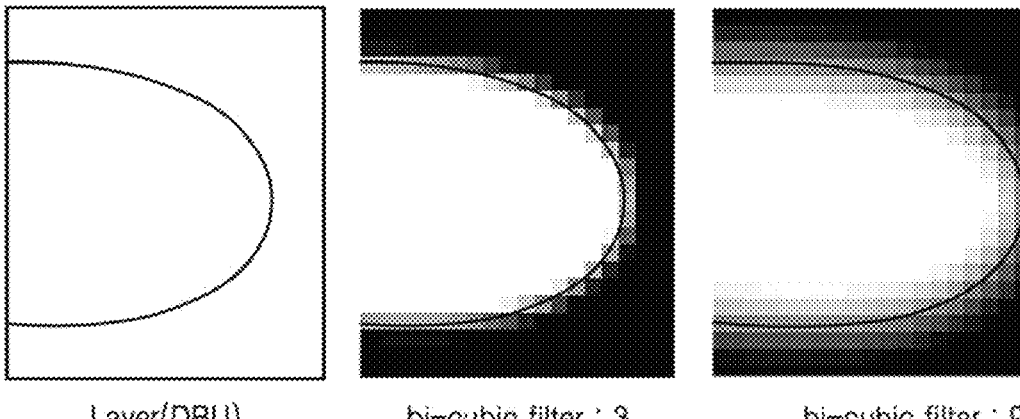

FIGS. 5A and 5B are conceptual diagrams for explaining a method of generating an image so as to secure sub-pixel level accuracy in an input image generating operation of the semiconductor device patterning method of FIG. 1. Descriptions already given with reference to FIGS. 1 to 4B are briefly given or omitted.

Referring to FIGS. 5A and 5B, in the generating of the input image of the semiconductor device patterning method of FIG. 1 above in operation 110, when converting a layout into an input image by rasterization, one pixel may be several nm in size, whereas the accuracy to be predicted may need to be less than about 1 nm. Accordingly, when converting to an input image, information should be preserved at a level less than a pixel, i.e., a sub-pixel level. Referring to FIG. 5A, it may be difficult to secure an accurate CD value depending on a filter used when converting an input image.

For reference, in FIG. 5A, the leftmost image is the original image, and the second from the left is a down-sampled image. Stepping (aliasing) may appear in the original image or in the down-sampled image. To remove this, anti-aliasing may be performed like the middle image, or the image may be resized using a Lanczos filter or a bi-cubic filter like the two images on the right.

In the semiconductor device patterning method according to the present example embodiment, upon rasterization to maintain accuracy at the sub-pixel level, the layout may be converted to an input image by using a windowed bi-cubic filter having a size that is less than the size of the minimum pattern. In addition, sub-pixel values may be interpolated from the input image by using a Shannon-sampling algorithm and a bi-linear or bi-cubic algorithm, and a CD value at a threshold may be extracted with the Newton-Raphson algorithm. Through this method, by not using a method of up-sampling the entire image, it may be possible to shorten the CD extraction time from the input image, and it may be possible to secure sub-pixel level accuracy.

For example, in FIG. 5B, after converting the layout of the database unit (DBU) of 0.1 nm level into a pixel image of approximately 1.75 nm by using a windowed bi-cubic filter, when calculating the difference between the CD value extracted from the input image and the CD value measured in the layout with errRMS, it may be confirmed that the difference has a very small value of about 0.034 nm. In FIG.

5B, 'bi-cubic filter: 3' may mean using 3*3 neighboring pixels, and 'bi-cubic filter: 9' may mean using 9*9 neighboring pixels.

FIGS. 6A to 7B are conceptual diagrams for explaining methods of removing a bad image in an input image generation operation of the semiconductor device patterning method of FIG. 1. Descriptions already given with reference to FIGS. 1 to 5B are briefly given or omitted.

Figure 6A:
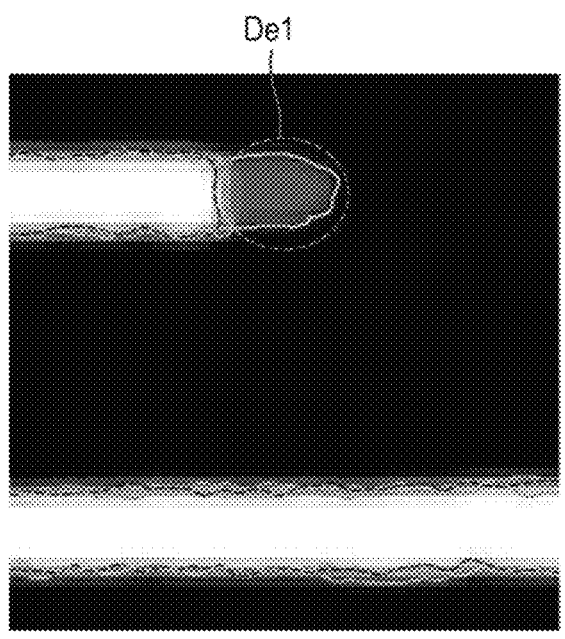
FIGS. 6A to 7B are conceptual diagrams for explaining methods of removing a bad image in an input image generation operation of the semiconductor device patterning method of FIG. 1.
Figure 6B:
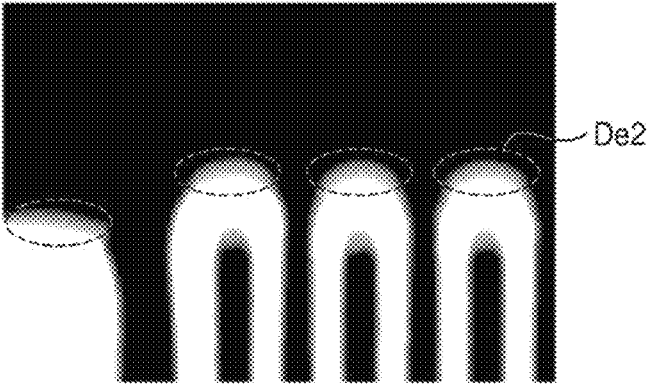

Referring to FIGS. 6A and 6B, to generate training images from wafer metrology images or wafer metrology data, such as ADI images, the semiconductor device patterning method according to the present example embodiment may extract N contour images from a wafer measurement image, rasterize the N contour images, and then use the average value. In this way, by using the average value after extraction and rasterization of a plurality of contour images, it may be possible to minimize the noise of the wafer metrology image.

On the other hand, in the case of wafer metrology images, because there may be cases where bad images are included, the semiconductor device patterning method according to the present example embodiment may include a method of automatically capturing a bad image and removing the bad image from a training image.

By way of background, when extracting contour images from a total of N images, if an erroneously calibrated image is included, the average $(\Sigma_k \Sigma_l\ I_{kl}/9)$ of pixel values of n*n clip images (n is an integer greater than or equal to 2), e.g., 3*3 clip images of the extracted contour image may have a value of 255/j (j: 2 to N, 8 bit image). Here, $I_{kl}$ means intensity of (k,l) pixels, and 9 is a number reflecting a 3*3 clip image. If all contour images are normal (when j=1), the average of pixel values may be 255. However, if there is a defect in even one of the N contour images (when j=2 to N), the average of the pixel values may be less than 255. In FIG. 6A, a portion of the bad image is indicated as a first defect De1, and an average of pixel values in the portion of the first defect De1 may be less than 255.

In addition, even when the standard deviation of the pixel value is less than the set value, this may be captured as a bad image and removed from the training image. In FIG. 6B, portions indicated by the second defect De2 may correspond to portions in which the standard deviation of the pixel value is less than a set value.

Figure 7A:
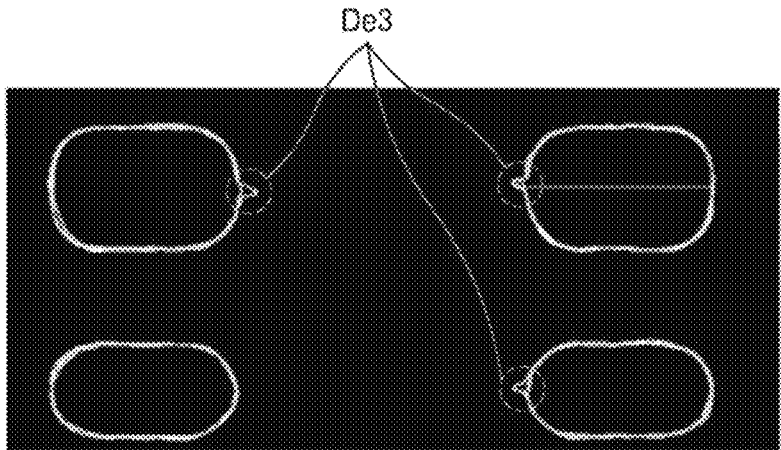
Figure 7B:
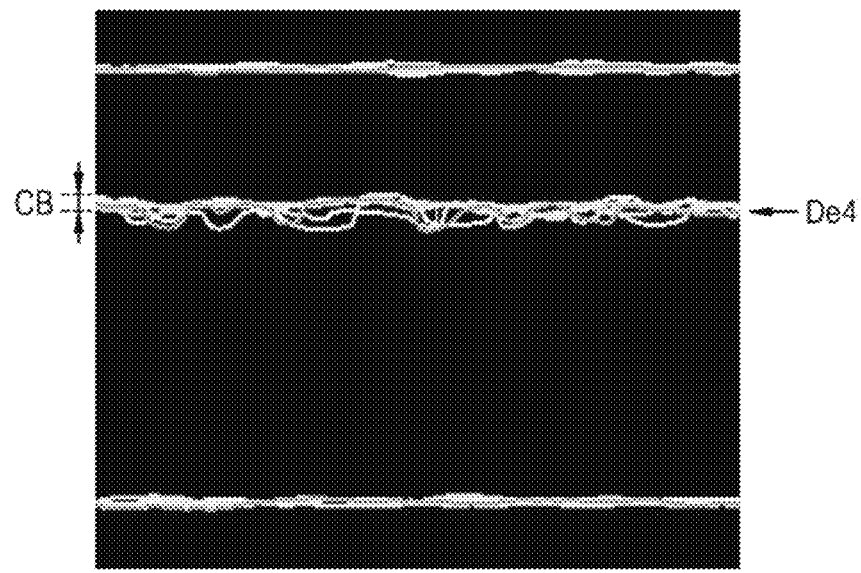

Referring to FIGS. 7A and 7B, the semiconductor device patterning method according to the present example embodiment may generate a contour band from a contour image, and if the value of this band is greater than the set value, it may be determined that the contour image is abnormal and it may be removed from the training image. Here, the contour band may be a concept corresponding to the variation width of contour lines in the contour image. In FIG. 7A, it is shown that each of three contour images among the four illustrated contour images includes a third defect De3 portion in which the contour band is greater than the set value. Also, in FIG. 7B, the contour bands of the upper and lower contour lines are less than the set value, and thus may be normal. On the other hand, the contour band CB of the middle contour lines may be greater than the set value. Accordingly, the middle contour lines may correspond to the fourth defect De4 portion.

In addition, the semiconductor device patterning method according to the present example embodiment may include a method of excluding a training image having a threshold value or higher by calculating a difference and variance from a target image using the output image generated by the predictive model after initial training using a DNN. Meanwhile, when the target image is T and the generated image is S, the difference and variance may be obtained by normalizing the pattern density to consider the pattern density of the target image. For example, the difference value may be expressed as $|\Sigma i,j Tij - Sij|/\Sigma i,j Tij$. Here, Tij and Sij may mean intensity of (i,j) pixels in the target image and the generated image, respectively. On the other hand, the variance may be expressed as an RMS value, i.e., a standard deviation.

The semiconductor device patterning method according to the present example embodiment may include a method of reflecting the influence of a pattern density received from a distance (hundreds of μm or more) more distant than an image used when learning using a DNN. That is, in the semiconductor device patterning method according to the present example embodiment, to reflect the pattern density from a distance, additionally, by making a density map for a full-chip as an input image, the input image may be added as a channel of the training image of the DNN. On the other hand, when generating the density map, e.g., by applying a Gaussian convolution, it may be possible to make the pattern density value of the density map reflect the influence from a greater area (several hundred μm) than the pixel size (usually several μm).

The density map may be generated using the RGB channel, and for example, the density may be reflected in the red channel. Accordingly, it may be seen that as the red area increases, the pattern density value increases.

Figure 8:
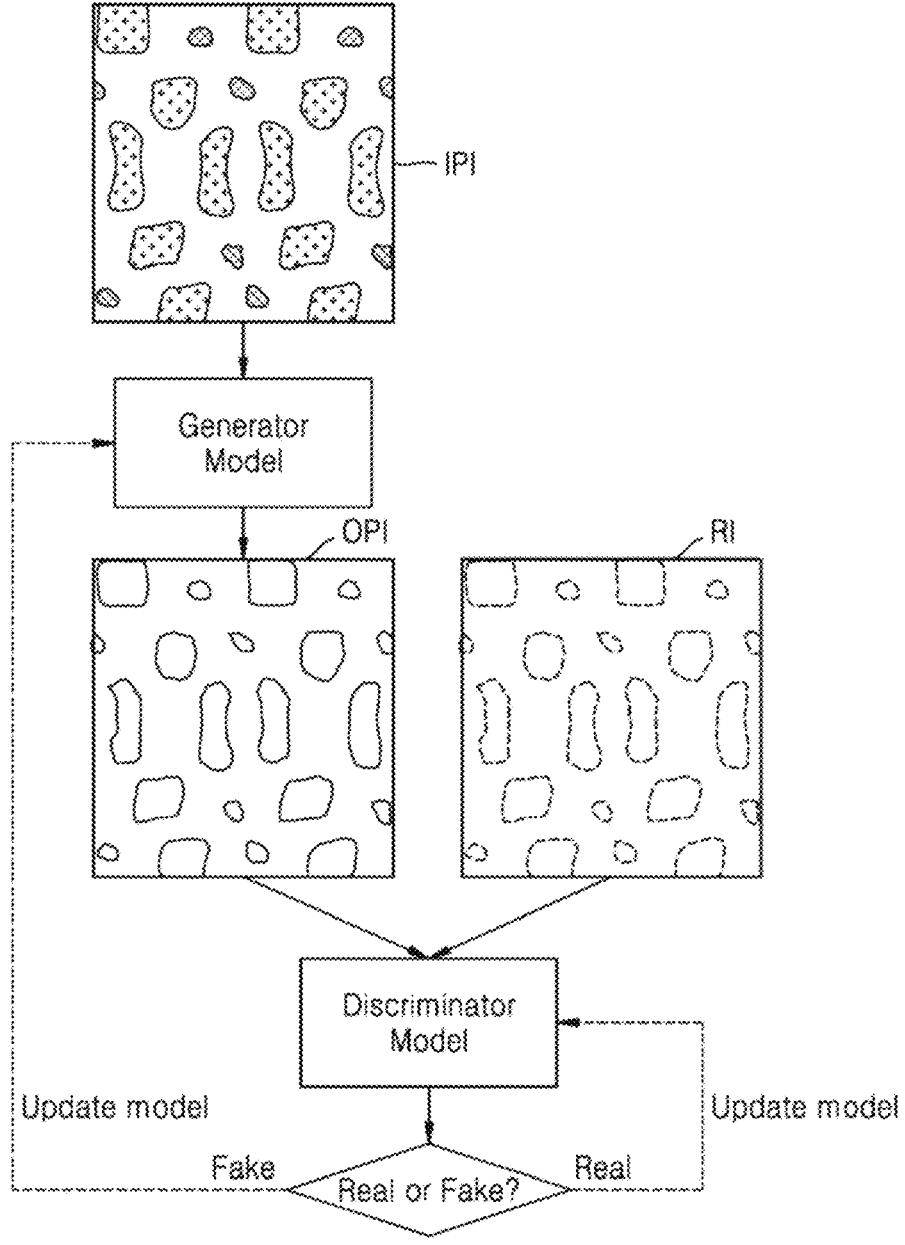
FIG. 8 is a conceptual diagram illustrating a process of generating a predictive model through learning using a DNN in the semiconductor device patterning method of FIG. 1.

FIG. 8 is a conceptual diagram illustrating a process of generating a predictive model through learning using a DNN in the semiconductor device patterning method of FIG. 1. Descriptions already given with reference to FIGS. 1 to 7B are briefly given or omitted.

Referring to FIG. 8, in the semiconductor device patterning method according to the present example embodiment, an input image and an output image may be used as a learning image of the DNN, e.g., the GAN.

Briefly describing GAN, GAN is a generative algorithm based on deep learning, and may include two sub-models. That is, the GAN may include a generator model and a discriminator model. The generator model may correspond to a predictive model in the semiconductor device patterning method according to the present example embodiment. The generator model generates new examples, and the discriminator model determines whether the generated examples are real data or fake data generated by the generator model.

For example, in relation to the semiconductor device patterning method according to the present example embodiment, the generator model may convert an input image to generate an output image after a preset semiconductor process. As described above, the input image may be generated by rasterizing the layout or by extracting the contour image from the ADI image and then rasterizing the contour image. Moreover, the output image may be an OPCed layout image or an ACI image. Moreover, the discriminator model may receive a reference image and the output image generated by the generator model. Here, the reference image may correspond to a target image to which the output image is required to arrive. For example, if the output image is an OPCed layout image, the reference image may be the final OPCed layout image used for actual mask manufacturing. Also, when the output image is an ACI image, the reference image may be a target pattern image of a semiconductor device. The discriminator model compares the output image with the reference image to determine whether the output image, generated by the generator model, is real or fake. In other words, in relation to the discriminator model, if the output image and the reference image are substantially the same, it may be determined that the output image is real, and if there is a difference between the output image and the reference image, it may be determined that the output image is fake.

Specifically, in FIG. 8, when an input image IP for the layout of a mask pattern is input to the generator model, the generator model generates an output image OPI. In addition, the output image OPI and the reference image RI are input to the discriminator model. The discriminator model determines whether the output image OPI is the same as the reference image RI. For example, if the output image is an OPCed layout image, the reference image RI may be the final OPCed layout image required, and the discriminator model determines whether the OPCed layout image is a real final OPCed layout image, or a fake different from the final OPCed layout image. After that, according to the determination result, the generator model and the discriminator model are continuously updated. By repeating this process over and over again, when the discriminator model reaches a level where it may no longer distinguish the output image OPI from the reference image RI, the learning is finished, and the generator model at this time may be adopted as the final predictive model. On the other hand, the discriminator model may be discarded when training is finished.

In the semiconductor device patterning method according to the present example embodiment, learning using a DNN may be based on an image. In other words, the input images generated through the rasterization described above may be used as learning images. In the semiconductor device patterning method according to the present example embodiment, to accurately simulate the patterning process (e.g., a photo process and an etching process), the DNN may include the following four characteristics:

1. It is required to reflect the influence of distantly located patterns.
2. The output image is required to produce a high-precision image that may guarantee sub-pixel level accuracy.
3. It is required to include models that are lightweight enough to perform full-chip simulations.
4. Since the pattern complexity is different for each layer of the semiconductor device, modeling is required to be possible by changing the architecture.

In the semiconductor device patterning method according to the present example embodiment, to reflect the above features, the DNN may be structured as follows. That is, the DNN includes a plurality of down-sample layers, and thus it may have a structure in which pixel correlation is possible to a long distance. The input image may be reduced to half the size in the output layer each time it passes through the down-sample layer. However, because the reduced image still includes pattern information corresponding to the same area as the input image, information represented by one pixel may correspond to twice the input image (or four times in terms of area). As a result, even if a kernel of the same size is used, a kernel acting on an image that has passed through more of the down-sample layer may express pixel correlation for a wider area. For example, when the input image and the image of the second down-sample layer are substantially the same image, and the image of the second down-sample layer is about ¼ (¹⁄₁₆ in terms of area) of the input image, the kernel corresponding to the second down-sample layer may cover a very small area in the input image, but may cover most of the area in the image of the second down-sample layer.

In the semiconductor device patterning method according to the present example embodiment, the DNN may adjust a pattern proximity range by adjusting an intra-image pixel correlation through the size of the kernel, the number of residual layers, the number of down-sample layers, and the like. Also, the kernels applied to the image passing through the deepest down-sample layer may simulate the effect of a pattern several μm away. For example, regions of the input image IN may be expressed in the form of four concentric circles with radii that increase by a factor of two, respectively; in correspondence thereto, in four residual blocks of the down-sample layer in the DNN, considering the scope of the kernels, the kernel of the down-sample layer of the fourth residual block may mimic the influence of the pattern on the entire input image IN, e.g., on the concentric circle having the largest radius among the concentric circles.

The DNN may include a masking layer that delimits or confines regions. The masking layer may be used for at least one of limiting boundary pixels, applying different weights for each image, and applying different weights to a main pattern and a dummy pattern.

In the semiconductor device patterning method according to the present example embodiment, for pixels outside the image, since the proximity effect is not effectively considered, by using a masking layer or a weight layer, information on the outer pixels may be excluded so as not to affect learning using the DNN. However, since the pattern information in this area affects the learning of the more inner area, in learning using the DNN, it may have a structure that is used for forward-propagation and not used for backward-propagation. Specifically, when the input image is output as an image in the crop region through DNN, i.e., an image of the back-propagation region, the crop region outside the back-propagation region is a masking layer, which can be used in the forward-propagation because it affects its inner back-propagation region. However, since the masking layer is affected in a further area, it may be excluded without consideration in the case of backward-propagation. For reference, an inspection region may be obtained through measurement, and may be used by cutting the entire inspection region into a crop region instead of the entire inspection region during learning.

The masking layer may be used to learn by applying different weights to the main pattern and the dummy pattern by additionally considering dummy pattern information. In addition, the masking layer may be used to adjust the pixel value corresponding to the back-propagation region, and to apply a different weight to each training image to enable weighted learning.

Figure 9:
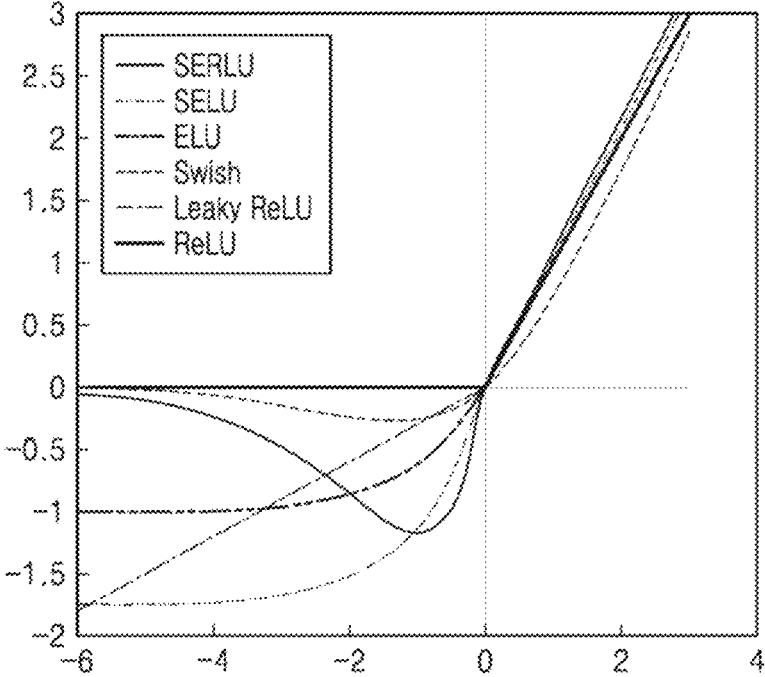
FIG. 9 is a graph of various activation functions used in the DNN in the semiconductor device patterning method of FIG. 1.

FIG. 9 is a graph of various activation functions used in DNN in the semiconductor device patterning method of FIG. 1. The content already described in the description part of FIGS. 1 to 8 will be briefly described or omitted.

Referring to FIG. 9, in the semiconductor device patterning method according to the present example embodiment, to generate the output image as a high-resolution image, the DNN may up-scale an image using a nearest-neighbor up-sampling or simply a nearest sampling method. The nearest sampling method is a sampling method using the nearest neighboring pixels. The nearest sampling method may not produce checkerboard artifacts. That is, in the case of a method using a de-convolution layer, checkerboard artifacts may occur because kernel overlap regions are not the same in the output image. Meanwhile, the DNN may use the bi-linear or bi-cubic algorithm, which was previously described in the description of FIGS. 5A and 5B, to generate a high-resolution image.

Also, in the semiconductor device patterning method according to the present example embodiment, the DNN may use a swish function as an activation function to generate a negative contribution during back-propagation. FIG. 9 shows graphs for various activation functions. In general, the ReLU function is possible to be used in a DNN, but as may be seen from the graph, in the case of the ReLU function, a negative contribution cannot occur. Moreover, in the DNN, the size of the input kernel may be adjusted so that the size of the convolution kernel of the input layer has a size similar to that of the filter used for rasterization.

In the semiconductor device patterning method according to the present example embodiment, to create a lightweight model, the DNN may use a layer fusion structure, a structure in which a residual block is applied before a down-sample layer, a dual residual block structure, and the like. The layer fusion structure is also called a sum-fusion layer.

A structure in which the residual block is applied before the down-sampling layer is also referred to as a residual block first structure, and down-sampling may be performed after passing through the residual block. As such, when the residual block is applied before the down-sample layer, because the complexity of the residual block may be transferred to the down-sample layer, more complex phenomena may be simulated without increasing model parameters. For reference, because the model parameter is determined by the kernel function, regardless of whether the residual block-first structure is employed, the structure of the DNN may include substantially the same model parameters.

The structure of the residual block may be divided into a single residual block and a dual-residual block. The single residual block may include two 2D-convolutional kernel functions and one activation function. In contrast, the dual-residual block may include two 2D-convolutional kernel functions and two activation functions. As described above, because the model parameter is determined by the kernel function, the model parameter of the residual block and the dual-residual block may be substantially the same. Accordingly, in the case of a dual-residual block, more diverse data paths may be generated using substantially the same model parameters, and as a result, the accuracy of the model may be improved.

In the semiconductor device patterning method according to the present example embodiment, in the up-scaling of the DNN, a sum-fusion layer and a concatenation layer may be used as layer functions. In the case of the concatenation layer, because the concatenation layer has a structure that is doubled in the channel direction, the concatenation kernel is also large and has many parameters. On the other hand, when a sum-fusion layer is generated through an element-wise sum without concatenating the layers, a similar output may be achieved while keeping the kernel small. Therefore, the sum-fusion layer may contribute to the weight reduction of the model.

In addition, in the semiconductor device patterning method according to the present example embodiment, the DNN may be designed to be used by adjusting a model layer and a loss function according to pattern complexity and a pattern proximity region. For example, in a DNN, it may be designed so that it may be possible to control the kernel size of input/output layer, the number of input/output channels of input layer, the kernel size of up-scale/down-scale layer, the number and kernel size of residual layers, the number of down-sample layers, whether or not to use DNN loss/gradient loss, and the pixel loss weight.

Figure 10:
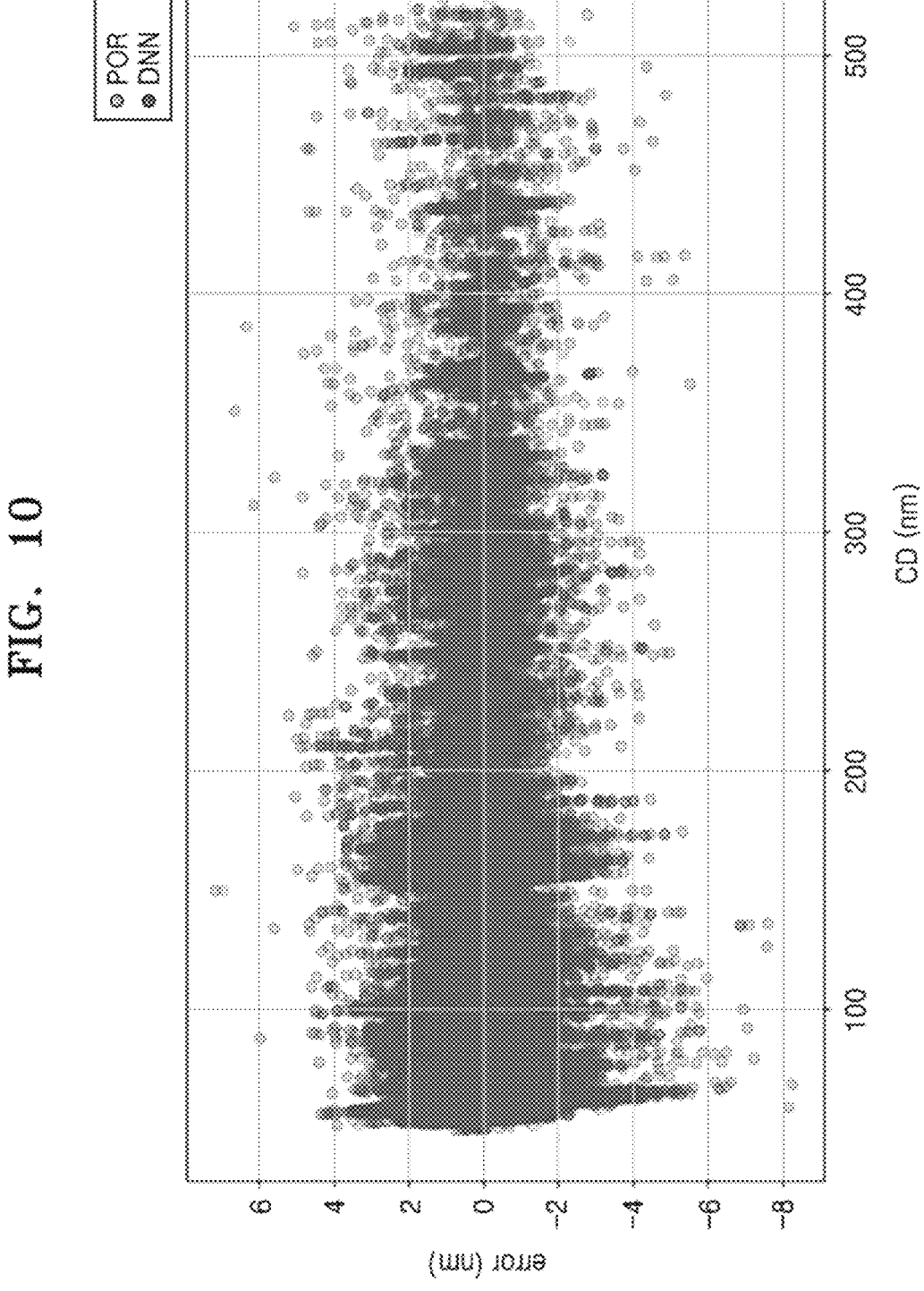
FIG. 10 is a graph showing the comparison of effects of the semiconductor device patterning method of FIG. 1 and a general comparative semiconductor device patterning method.

FIG. 10 is a graph showing the comparison of effects of the semiconductor device patterning method of FIG. 1 ("DNN" in FIG. 10) and a general comparative semiconductor device patterning method ("POR" in FIG. 10). Descriptions already given with reference to FIGS. 1 to 9 are briefly given or omitted.

Referring to FIG. 10, the semiconductor device patterning method according to the present example embodiment may secure model accuracy that exceeds the accuracy limit of the comparative model through learning using a DNN. Also, in the semiconductor device patterning method according to the present example embodiment, image conversion using a DNN and predictive model generation are applicable to both a PR model and an etch model through adjustment of an architecture control parameter. Furthermore, iterationless correction may be possible depending on the modeling direction. This may reduce the number of model applications more than 10 times compared to the comparative method of performing correction through repeated model application, and thus may contribute to significantly reducing the total correction time.

As may be seen from FIG. 10, as a result of comparing the accuracy of the comparative model POR for the etching process and the model DNN generated through learning using a DNN, e.g., GAN, of the semiconductor device patterning method according to the present example embodiment, the accuracy of the model DNN according to the present example embodiment is shown as 0.64 nm (errRMS), and the accuracy of the comparative model POR is shown as 1.04 nm (errRMS). Therefore, it may be confirmed that the model DNN according to the present example embodiment is improved in performance by about 40% compared to the comparative model POR.

As described above, embodiments may provide a semiconductor device patterning method capable of accurately predicting and patterning pattern information after a certain semiconductor process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device patterning method, comprising:

generating an input image by imaging information about a pattern of a sample;

acquiring an output image of the pattern of the sample after a preset semiconductor process with respect to the sample;

generating a predictive model through learning using a Deep Neural Network (DNN) with the input image and the output image; and predicting a pattern image after the semiconductor process for a pattern of a semiconductor device by using the predictive model, wherein:

the information about the pattern of the sample is an After Develop Inspection (ADI) image for the pattern of the sample, the output image is an After Cleaning Inspection (ACI) image for the pattern of the sample, and the generating of the input image includes:

extracting a contour image from the ADI image; and rasterizing the contour image.

2. The method as claimed in claim 1, wherein windowed bi-cubic filter is used in rasterizing the contour image.

3. The method as claimed in claim 2, further comprising:

interpolating a value of a level less than a pixel using a Shannon-sampling algorithm and a bi-linear or bi-cubic algorithm in the input image; and extracting a critical dimension (CD) value from a threshold with a Newton-Raphson algorithm.

4. The method as claimed in claim 1, wherein:

the extracting of the contour image includes excluding the ADI image, when an average of pixel values of a n*n clip image (n is an integer greater than or equal to 2) is 255/j (j:2 to N, 8-bit image) among the N contour images, and a standard deviation of pixel values is less than a set value, and the rasterizing of the contour image includes using an average value after rasterizing the N contour images.

5. The method as claimed in claim 1, further comprising generating a contour band from the contour image and excluding the contour image, when a value of the contour band is greater than a set value.

6. The method as claimed in claim 1, further comprising generating a density map for a full-chip of the sample, and adding the density map as the input image to a channel.

7. The method as claimed in claim 1, wherein the DNN includes a plurality of down-sample layers.

8. A semiconductor device patterning method, comprising:

generating an input image by rasterizing a layout of a mask pattern corresponding to a pattern of a sample;

obtaining an image of an Optical Proximity Corrected (OPCed) layout for the mask pattern as an output image;

generating a predictive model through learning using a Deep Neural Network (DNN) with the input image and the output image;

predicting an image of an OPCed layout for a pattern of a semiconductor device by using the predictive model;

determining whether the predicted image of the OPCed layout satisfies a set condition;

manufacturing a mask based on the image of the OPCed layout when the condition is satisfied; and forming a pattern on a semiconductor device by using the mask, wherein the DNN includes a mask-layer that delimits or confines regions.

9. The method as claimed in claim 8, wherein the generating of the input image by rasterizing includes using a windowed bi-cubic filter in the rasterization, and the method further comprises interpolating a value of a level less than a pixel using a Shannon-sampling algorithm and a bi-linear or bi-cubic algorithm in the input image and extracting a critical dimension (CD) value from a threshold with a Newton-Raphson algorithm.

10. The method as claimed in claim 8, wherein:

the DNN includes a plurality of down-sample layers, the DNN uses at least one of a residual block structure, a dual residual block structure, a sum-fusion layer, a residual block first structure, a nearest-neighbor, bi-linear, or bi-cubic sampling method up-scaling, and a swish activation function.

11. The method as claimed in claim 8, wherein:

the DNN uses a different structure according to a semiconductor process to be modeled through architecture parameter adjustment, and the architecture parameter adjustment includes at least one of an adjustment of a number of down-sample layers, an adjustment of a number of residual blocks, a size adjustment of a kernel in the residual block, a size adjustment of an input kernel according to a size of a rasterization filter, and an adjustment of a number of model parameters according to layout complexity.

12. A semiconductor device patterning method, comprising:

acquiring an After Develop Inspection (ADI) image of a pattern of a sample;

extracting a contour image from the ADI image;

generating an input image by rasterizing the contour image;

obtaining an After Cleaning Inspection (ACI) image for the pattern of the sample after an etching process for the sample as an output image;

generating a predictive model through learning using a Deep Neural Network (DNN) with the input image and the output image;

predicting a pattern image of a semiconductor device after the etching process by using the predictive model;

determining whether the predicted pattern image after the etching process satisfies a set condition; and forming a pattern on the semiconductor device through the etching process when the condition is satisfied.

13. The method as claimed in claim 12, further comprising automatically filtering and removing bad images from the acquiring of the ADI image to the generating of the input image.

14. The method as claimed in claim 12, further comprising generating a density map for a full-chip of the sample, and adding the density map as the input image to a channel.

15. The method as claimed in claim 12, wherein the DNN includes a masking layer that delimits or confines regions.

16. The method as claimed in claim 12, wherein:

the DNN includes a plurality of down-sample layers, and the DNN uses at least one of a residual block structure, a dual residual block structure, a sum-fusion layer, a residual block first structure, a nearest-neighbor, bi-linear, or bi-cubic sampling method up-scaling, and a swish activation function.

17. The method as claimed in claim 12, wherein:

the DNN uses a different structure according to a semiconductor process to be modeled through architecture parameter adjustment, the architecture parameter adjustment includes at least one of an adjustment of a number of down-sample layers, an adjustment of a number of residual blocks, a size adjustment of a kernel in the residual block, a size adjustment of an input kernel according to a size of a rasterization filter, and an adjustment of a number of model parameters according to layout complexity.

* * * * *